(12) United States Patent
Zhang

(10) Patent No.: US 11,837,266 B2
(45) Date of Patent: Dec. 5, 2023

(54) ENHANCED TL-TCAM LOOKUP-TABLE HARDWARE SEARCH ENGINE

(71) Applicant: DALIAN UNIVERSITY OF TECHNOLOGY, Dalian (CN)

(72) Inventor: Jianwei Zhang, Dalian (CN)

(73) Assignee: DALIAN UNIVERSITY OF TECHNOLOGY, Dalian (CN)

( * ) Notice: Subject to any disclaimer, the term of this patent is extended or adjusted under 35 U.S.C. 154(b) by 0 days.

(21) Appl. No.: 17/778,095

(22) PCT Filed: Dec. 31, 2021

(86) PCT No.: PCT/CN2021/143501
§ 371 (c)(1),
(2) Date: May 19, 2022

(87) PCT Pub. No.: WO2023/123305
PCT Pub. Date: Jul. 6, 2023

(65) Prior Publication Data
US 2023/0207009 A1 Jun. 29, 2023

(30) Foreign Application Priority Data
Dec. 29, 2021 (CN) .......................... 202111640569.0

(51) Int. Cl.
*G11C 15/04* (2006.01)
*G11C 15/00* (2006.01)

(52) U.S. Cl.
CPC .............. *G11C 15/04* (2013.01); *G11C 15/00* (2013.01)

(58) Field of Classification Search
CPC ...................................................... G11C 15/00
See application file for complete search history.

(56) References Cited

U.S. PATENT DOCUMENTS

| 2016/0172037 A1* | 6/2016 | Lee | G11C 16/26 365/185.12 |
| 2019/0278604 A1* | 9/2019 | Zhang | G06F 16/90339 |
| 2022/0223207 A1* | 7/2022 | Deshpande | G11C 15/04 |

FOREIGN PATENT DOCUMENTS

| CN | 108055206 A | 5/2018 |
| CN | 108199969 A | 6/2018 |

OTHER PUBLICATIONS

Mohan, Nitin, et al; Low-Capacitance and Charge-Shared Match Lines for Low-Energy High-Performance TCAMs; IEEE Journal of Solid-State Circuits, vol. 42, No. 9, Sep. 2007; pp. 2054-2060.

* cited by examiner

*Primary Examiner* — Joshua L Schwartz
(74) *Attorney, Agent, or Firm* — HAUPTMAN HAM, LLP

(57) ABSTRACT

An enhanced TL-TCAM lookup-table hardware search engine includes a plurality of enhanced TL-TCAM cell circuits. There are m enhanced TL-TCAM cells circuits connected in parallel to form a sub-segment circuit. The word line WL, match line ML and ML_x of each enhanced TL-TCAM cell circuit in the sub-segment circuit are respectively short-connected together, the match line ML is connected to the drain electrode of an N-type transistor N15, ML_x is connected to the gate electrode of the N-type transistor N15, and the source electrode of the N-type transistor N15 is connected to ground, ML_x is connected to the drain electrode of an N-type transistor N14, the source electrode of the N-type transistor N14 is connected to ground, and the gate electrode of the N-type transistor N14 is connected to the signal line OneX_in-Sement_b, a plurality of sub-segment circuits are connected in parallel to form a word circuit.

2 Claims, 4 Drawing Sheets

ENHANCED TL-TCAM LOOKUP-TABLE HARDWARE SEARCH ENGINE

RELATED APPLICATIONS

The present application is a U.S. National Phase of International Application Number PCT/CN2021/143501 filed Dec. 31, 2021, and claims priority to Chinese Application Number 2021116405690, filed Dec. 29, 2021.

TECHNICAL FIELD

The present invention belongs to the field of information technologies and relates to an enhanced TL-TCAM lookup-table hardware search engine.

BACKGROUND

The inventor continues to study on this circuit and finds that if every 2 bits of a TCAM cell Tcell are combined and optimized to form a new circuit cell TL-Tcell, it can reduce the parasitic capacitance of the match line by half, and the probability of power consumption of search line flipping by half, and thus the performance is greatly improved. Data stored in the TL-Tcell cell needs to be gotten from a TCAM after being processed.

The TCAM (Ternary Content-Addressable Memory) is a high-speed hardware search engine, which is widely used in search-intensive operations, such as routers in a backbone network/edge network in the Internet, to realize routing table lookup and packet forwarding, a BiCAM (Binary CAM) can only store 1-bit data 0 or 1, while the TCAM can store three values of 0, 1, and X, wherein X is a wildcard, which can represent either 0 or 1.

According to the difference of working principle, a match line of the TCAM (Ternary Content-Addressable Memory) is mainly divided into NOR-type and NAND-type. As shown in FIG. 1, the TCAM is mainly composed of a memory cell, a match line ML, a search line SL, and comparison transistors M1-M4. The memory cell is a 6-transistor SRAM cell. FIG. 1 omits two read-write access transistors. The function description of the cell circuit is as shown in Table 1.

TABLE 1

TCAM cell coding

| NOR-type TCAM cell | | | NAND-type TCAM cell | | |
|---|---|---|---|---|---|
| Representation value | Nodal value (D, D#) | Search value (SL, SL#) | Representation value | Nodal value (D, M) | Search value (SL, SL#) |
| 0 | (0, 1) | (0, 1) | 0 | (0, 0) | (0, 1) |
| 1 | (1, 0) | (1, 0) | 1 | (1, 0) | (1, 0) |
| X | (1, 1) | (0, 0) | X | (0, 1) | (1, 1) |
| reserved | (0, 0) | (1, 1) | X | (1, 1) | (1, 1) |

A NOR-type TCAM word circuit is formed by connecting NOR-type TCAM cells in parallel. A NAND-type TCAM word circuit is formed by connecting NAND-type TCAM cells in series. As shown in FIG. 2, a NOR-type match line structure is to connect match lines ML of the NOR-type TCAM cells in parallel, whereas a NAND-type match line is to connect the NAND-type TCAM cells in series. The TCAM is consisted of an array composed of word circuits, a decoder, and an apriority encoder, as shown in FIG. 3. When the TCAM works, all word circuits are activated simultaneously, resulting in high power consumption of the TCAM. The power consumption of a typical TCAM chip is about 25 watts. How to reduce power consumption without affecting the search speed is a major research direction of scholars at home and abroad.

In 2007, N. Mohan et al. proposed a NOR-type low parasitic capacitance TCAM cell structure (refer to [1] N. Mohan, et al., "Low-Capacitance and Charge-Shared Match Lines for Low-Energy High-Performance TCAMs," IEEE JSSC, vol. 42, no. 9, pp. 2054-2060, September 2007 for details), as shown in FIG. 4. There is only one transistor M1 on the match line ML, whereas two transistors M1 and M2 are connected to the ML of a conventional 16T NOR-type TCAM cell (refer to FIG. 1(a)). The parasitic capacitance is reduced, the power consumption is also reduced, and the circuit speed can be accelerated.

In 2017, Zhang Jianwei et al. proposed a compact lookup-table hardware search engine and a data conversion method thereof (refer to [2] Zhang Jianwei et al., Compact lookup-table Hardware Search Engine and Data Conversion Method Thereof, invention patent No.: 201711402026.9; and [3] Jianwei Zhang, etc., Lookup-Table Hardware Search Engine, U.S. Pat. No. 10,831,487 B2).

In 2017, Zhang Jianwei et al. proposed a lookup-table hardware search engine (refer to [4] Zhang Jianwei et al., Lookup-Table Hardware Search Engine, invention patent No.: 201711402362.3), as shown in FIG. 5.

However, there are still problems of high power consumption and slow speed in the existing technique, and an enhanced TL-TCAM (ETL-TCAM) hardware search engine is proposed.

SUMMARY

To solve the problems above, the present invention proposes an enhanced TL-TCAM lookup-table hardware search engine, wherein each word circuit includes a plurality of enhanced TL-TCAM cell circuits; the proposed enhanced TL-TCAM cell circuit includes four memory cells MC1-MC4 and thirteen N-type transistors N1-N13; the memory cell MC adopts a bistable circuit structure, the stored value is located at the T terminal of the memory cell MC, and the F terminal of the memory cell MC stores its "NOT" value. The gate electrode of the N-type transistor N1 is connected to OneX, the source electrode of the N-type transistor N1 is connected to the power supply, the drain electrode of the N-type transistor N1 is connected to the source electrode of the N-type transistor N2, the drain electrode of the N-type transistor N2 is connected to the source electrode of the N-type transistor N3, the drain electrode of the N-type transistor N3 is connected to ML_X, the gate electrode of the N-type transistor N3 is connected to the source electrode of the N-type transistor N7, the gate electrode of the N-type transistor N7 is connected to XSL_11, the drain electrode of the N-type transistor N7 is connected to the F terminal of the memory cell MC2, the T terminal of the memory cell MC2 is connected to the source electrode of the N-type transistor N6, the gate electrode of the N-type transistor N6 is connected to LSL_11, the drain electrode of the N-type transistor N6 is connected the source electrode of the N-type transistor N5, the gate electrode of the N-type transistor N5 is connected to LSL_00, the drain electrode of the N-type transistor N5 is connected to the T terminal of the memory cell MC1, the F terminal of the memory cell MC1 is connected to the source electrode of the N-type transistor N4, the gate electrode of the N-type transistor N4 is connected to XSL_00, the drain electrode of the N-type transistor N4 is connected to the source electrode of the N-type transistor N12, the gate electrode of the N-type transistor N12 is connected to the word line WL, the drain electrode of the N-type transistor N12 is connected to the bit line BL1, the drain electrode of the N-type transistor N4 is connected to the source electrode of the N-type transistor N7 through the MA line, the gate electrode of the N-type transistor N2 is connected to the source electrode of the N-type transistor N8, the gate electrode of the N-type transistor N8 is connected to XSL_10, the drain electrode of the N-type transistor N8 is connected to the F terminal of the memory cell MC3, the T terminal of the memory cell MC3 is connected to the source electrode of the N-type transistor N9, the gate electrode of the N-type transistor N9 is connected to LSL_10, the drain electrode of the N-type transistor N9 is connected to the source electrode of the N-type transistor N10, the gate electrode of the N-type transistor N10 is connected to LSL_01, the drain electrode of the N-type transistor N10 is connected to the T terminal of the memory cell MC4, the F terminal of the memory cell MC3 is connected to the source electrode of the N-type transistor N11, the gate electrode of the N-type transistor N11 is connected to XSL_01, the drain electrode of the N-type transistor N11 is connected to the source electrode of the N-type transistor N13, the gate electrode of the N-type transistor N13 is connected to the word line WL, the drain electrode of the N-type transistor N13 is connected to the bit line BL2, the drain electrode of the N-type transistor N11 is connected to the gate electrode of the N-type transistor N2 through the MB line, the source electrode of the N-type transistor N5 is connected to the drain electrode of the N-type transistor N9 through the match line ML;

There are m (m is a positive integer) enhanced TL-TCAM cells circuits connected in parallel to form a sub-segment circuit, a word line WL, a match line ML and ML_x of each enhanced TL-TCAM cell circuit in the sub-segment circuit are respectively short-connected together, the match line ML is connected to the drain electrode of the N-type transistor N15, the ML_x is connected to the gate electrode of the N-type transistor N15, the source electrode of the N-type transistor N15 is connected to ground, the ML_x is connected to the drain electrode of the N-type transistor N14, the source electrode of the N-type transistor N14 is connected to ground, the gate electrode of the N-type transistor N14 is connected to the signal line OneX_in-Sement_b, and the plurality of sub-segment circuits are connected in parallel to form a word circuit.

The present invention has the following beneficial effects:

The method can further reduce power consumption, improve speed, and is more universal.

1. The number of transistors is reduced. An ETL-TCell has a total of 29 transistors, compared with 32 transistors in Documents [2-4] (considering read-write operations).

2. ML pull-down channel is faster and the search speed is higher.

The NOR-type ML pull-down channel in Documents [2-4] consists of two transistors (refer to N2 and N4 in FIG. 5(a)). The word circuit of the present patent also belongs to the NOR-type structure, and the ML pull-down channel has only one transistor (refer to N15 in FIG. 9).

3. The universality is higher.

Different from Documents [2-4], the circuit structure proposed in the present patent is applicable to all circuits regardless of how many G_Xs are in the ETL-Tcell, and can work normally.

4. The ML power consumption is further reduced.

Refer to FIG. 5, in addition to the match line ML, the word circuit in Documents [2-4] also has a local match line LML, and the LML is almost full voltage swing. However, the word circuit in the present invention eliminates the local match line structure, and the power consumption is further reduced.

In addition, in a typical network search application, the probability of an odd number of G_X appears is low. Therefore, the power consumption caused by ML_x in the ETL-TCell is basically little, and the main power consumption is caused by the ML. The power consumption of the ML is greatly reduced by eliminating the LML.

BRIEF DESCRIPTION OF THE DRAWINGS

FIGS. 1(a) and 1(b) are schematic diagrams of the TCAM cell, wherein FIG. 1(a) is a NOR-type TCAM cell.

FIGS. 2(a) and 2(b) are schematic diagrams of the TCAM word circuit structure, wherein FIG. 2(a) is a NOR-type match line and FIG. 2(b) is a NAND-type match line;

FIGS. 5(a) and 5(b) are schematic diagrams of the lookup-table search engine structure, wherein FIG. 5(a) is a NOR-type lookup-table search engine cell structure, FIG. 5(b) is a NAND-type lookup-table search engine cell structure;

DETAILED DESCRIPTION

Figure 6:
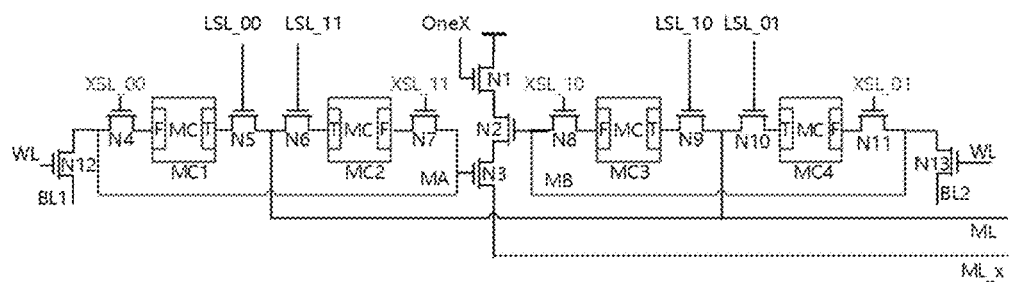
FIG. 6 is a diagram of an ETL-TCAM circuit structure (ETL-TCell)
Figure 7:
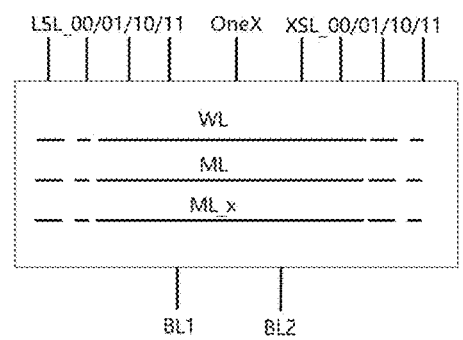
FIG. 7 is a simplified symbol diagram of the ETL-TCAM circuit structure.
Figure 8:
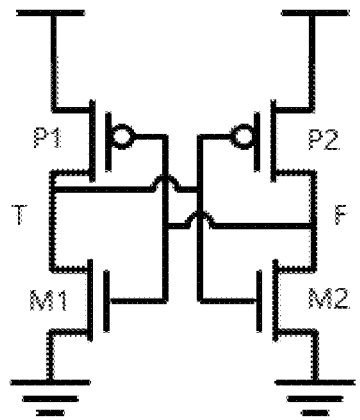
FIG. 8 is a circuit structure diagram of the MC circuit, the MC circuit adopts a bistable circuit structure.

As shown in FIG. 6 and FIG. 7, an enhanced TL-TCAM lookup-table hardware search engine is provided. Each word circuit includes a plurality of enhanced TL-TCAM cell circuits. Each enhanced TL-TCAM cell circuit includes four memory cells MC1-MC4 and thirteen N-type transistors N1-N13. The memory cell MC adopts a bistable circuit structure. The stored value is located at the T terminal of the memory cell MC, and the F terminal of the memory cell MC stores its "NOT" value. The gate electrode of the N-type transistor N1 is connected to OneX, the source electrode of the N-type transistor N1 is connected to the power supply, the drain electrode of the N-type transistor N1 is connected to the source electrode of the N-type transistor N2, the drain electrode of the N-type transistor N2 is connected to the source electrode of the N-type transistor N3, the drain electrode of the N-type transistor N3 is connected to ML_X, the gate electrode of the N-type transistor N3 is connected to the source electrode of the N-type transistor N7, the gate electrode of the N-type transistor N7 is connected to XSL_11, the drain electrode of the N-type transistor N7 is connected to the F terminal of the memory cell MC2, the T terminal of the memory cell MC2 is connected to the source electrode of the N-type transistor N6, the gate electrode of the N-type transistor N6 is connected to LSL_11, the drain electrode of the N-type transistor N6 is connected the source electrode of the N-type transistor N5 the gate electrode of the N-type transistor N5 is connected to LSL_00, the drain electrode of the N-type transistor N5 is connected to the T terminal of the memory cell MC1, the F terminal of the memory cell MC1 is connected to the source electrode of the N-type transistor N4, the gate electrode of the N-type transistor N4 is connected to XSL_00, the drain electrode of the N-type transistor N4 is connected to the source electrode of the N-type transistor N12, the gate electrode of the N-type transistor N12 is connected to the word line WL, the drain electrode of the N-type transistor N12 is connected to the bit line BL1, the drain electrode of the N-type transistor N4 is connected to the source electrode of the N-type transistor N7 through the MA line, thegate electrode of the N-type transistor N2 is connected to the source electrode of the N-type transistor N8, the gate electrode of the N-type transistor N8 is connected to XSL_10, the drain electrode of the N-type transistor N8 is connected to the F terminal of the memory cell MC3, the T terminal of the memory cell MC3 is connected to the source electrode of the N-type transistor N9, the gate electrode of the N-type transistor N9 is connected to LSL_10, the drain electrode of the N-type transistor N9 is connected to the source electrode of the N-type transistor N10, the gate electrode of the N-type transistor N10 is connected to LSL_01, the drain electrode of the N-type transistor N10 is connected to the T terminal of the memory cell MC4, the F terminal of the memory cell MC3 is connected to the source electrode of the N-type transistor N11, the gate electrode of the N-type transistor N11 is connected to XSL_01, the drain electrode of the N-type transistor N11 is connected to the source electrode of the N-type transistor N13, the gate electrode of the N-type transistor N13 is connected to the word line WL, the drain electrode of the N-type transistor N13 is connected to the bit line BL2 the drain electrode of the N-type transistor N11 is connected to the gate electrode of the N-type transistor N2 through the MB line, the source electrode of the N-type transistor N5 is connected to the drain electrode of the N-type transistor N9 through the match line ML.

Figure 9:
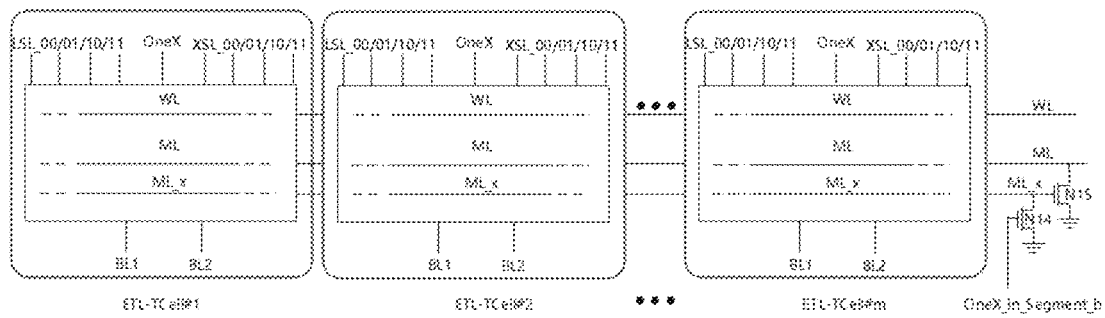
FIG. 9 is a sub-segment circuit composed of a plurality of ETL-TCells.
Figure 10:
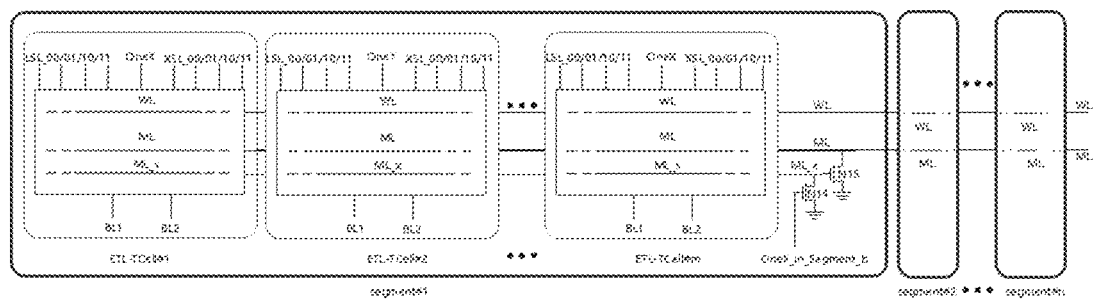
FIG. 10 is a structure diagram of a word circuit formed by connecting a plurality of sub-segment circuits in parallel.

There are m (m is a positive integer) enhanced TL-TCAM cells circuits connected in parallel to form a sub-segment circuit. The word line WL, the match line ML and ML_x of each enhanced TL-TCAM cell circuit in the sub-segment circuit are respectively short-connected together. The match line ML is connected to the drain electrode of the N-type transistor N15, the ML_x is connected to the gate electrode of the N-type transistor N15, the source electrode of the N-type transistor N15 is grounded, the ML_x is connected to the drain electrode of the N-type transistor N14, the source electrode of the N-type transistor N14 is connected to ground, the gate electrode of the N-type transistor N14 is connected to the signal line OneX_in-Sement_b, refer to FIG. 9 for details. The plurality of sub-segment circuits is connected in parallel to form a word circuit, refer to FIG. 10 for details.

The source of data stored in the ETL-TCAM can refer to the data conversion method in the lookup-table TCAM and the conventional TCAM [2-4]. It is assumed that the data is converted and stored in each ETL-TCell cell.

Figure 1A:
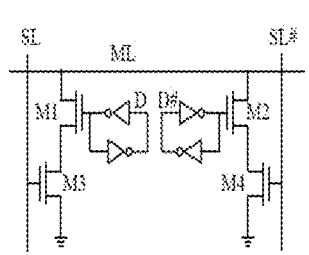
Figure 1B:
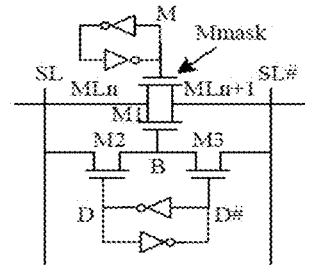
Figure 2A:
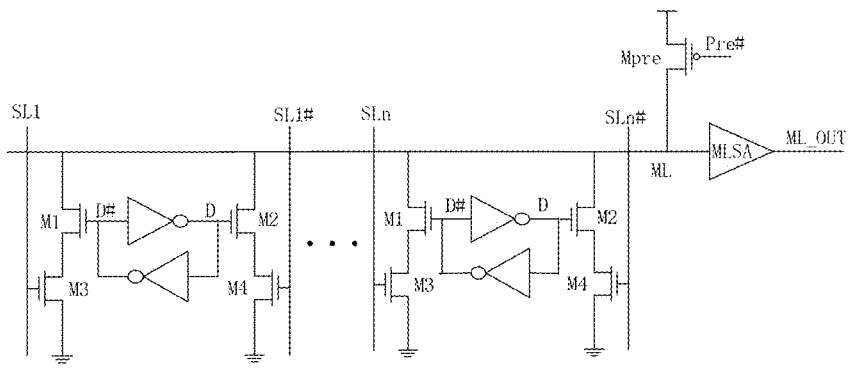
Figure 2B:
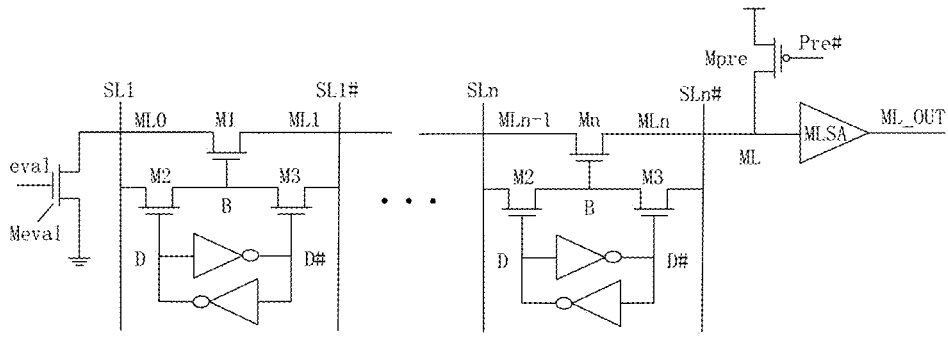
FIG. 2(b) is a NAND-type TCAM cell.
Figure 3:
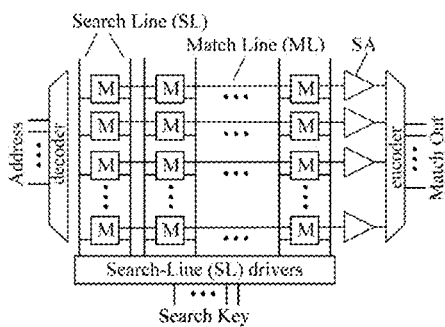
FIG. 3 is a simple CAM block diagram.
Figure 4:
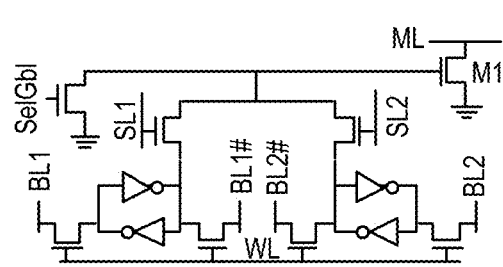
FIG. 4 is a schematic diagram of a low parasitic capacitance TCAM structure.
Figure 5A:
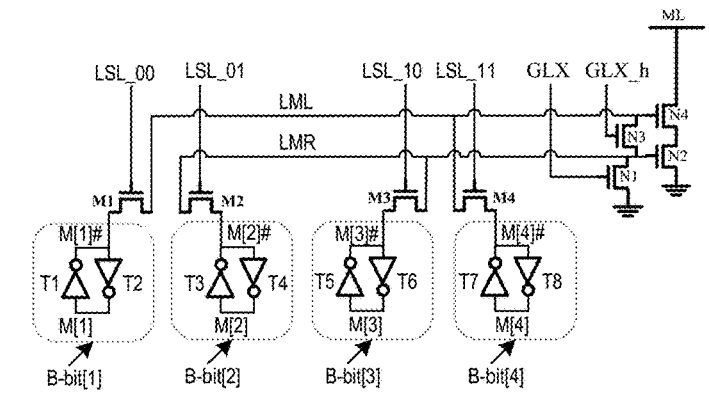
Figure 5B:
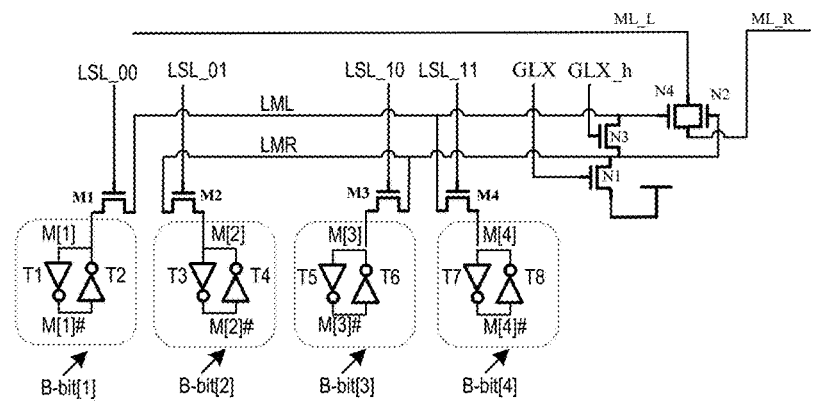

The search line generation method in the ETL-TCell cell is as follows:

A conventional TCAM cell consists of two SRAM cells, and can be inputted through two search lines SL1 and SL2, such as the TCAM cell in FIG. 4. Suppose the input search word SLW is represented by (SL1, SL2), and input SLW=0= (SL1, SL2)=(0, 1), input SLW=1=(SL1, SL2)=(1, 0), input SLW=global X=(SL1, SL2)=(0, 0). For convenience, we abbreviate global X as G_X.

Figure 11:
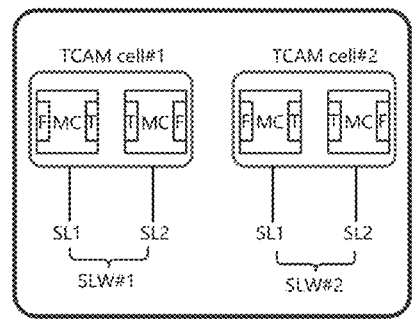
FIG. 11 is a schematic circuit diagram of two conventional TCAM cells (only the memory cell part is simply drawn, and others are omitted)

In the present invention, one ETL-TCell cell corresponds to two conventional TCAM cells. Moreover, the search line of one ETL-TCell cell consists of LSL, XSL and OneX. For the convenience of comparison, comparison of two conventional TCAM cells and one ETL-TCell is provided. The circuit diagram of two conventional TCAM cells is as shown in FIG. 11, only the memory cell part is simply drawn, and the corresponding search line representations are shown in Table 2.

TABLE 2

Search line representations of two conventional TCAM cells

| TCAM Cell#1 (TCell#1) | | TCAM Cell#2 (TCell#2) | |
|---|---|---|---|
| SLW | (SL1, SL2) | SLW | (SL1, SL2) |
| 0 | (0, 1) | 0 | (0, 1) |
| 1 | (1, 0) | 1 | (1, 0) |
| G_X | (0, 0) | G_X | (0, 0) |

Figure 12:
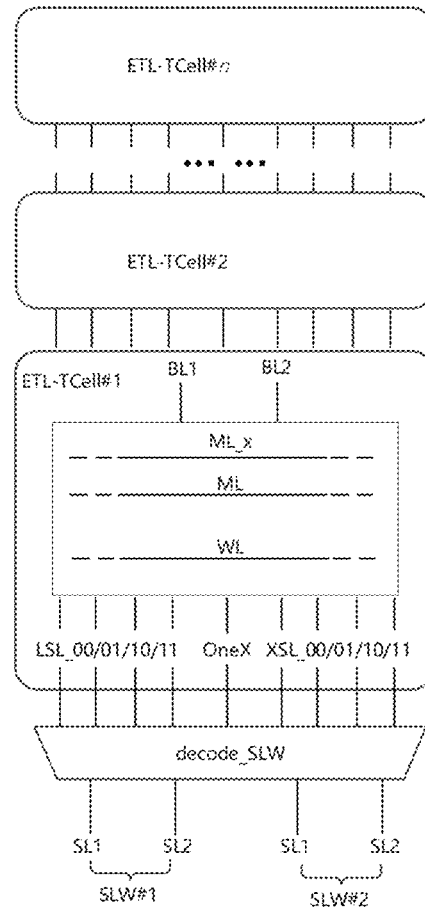
FIG. 12 is an ETL-TCell search line generated by search line decoding (decode_SLW) of a conventional TCAM cell.

As shown in FIG. 12, LSL_00, LSL_01, LSL_10, LSL_11, XSL_00, XSL_01, XSL_10, XSL_11, and OneX of a word circuit array are respectively connected to a decoder decode_SLW, and a truth table of the decoder decode_SLW is as shown in Table 3:

TABLE 3

Truth table of decoder decode_SLW

| (SLW#1, SLW#2) | | LSL_00 | LSL_01 | LSL_10 | LSL_11 | OneX | XSL_00 | XSL_11 | XSL_01 | XSL_10 |
|---|---|---|---|---|---|---|---|---|---|---|
| No G_X | (0, 0) | 1 | — | — | — | — | — | — | — | — |
| | (0, 1) | — | 1 | — | — | — | — | — | — | — |
| | (1, 0) | — | — | 1 | — | — | — | — | — | — |
| | (1, 1) | — | — | — | 1 | — | — | — | — | — |
| 2 G_X | (G_X, G_X) | — | — | — | — | — | — | — | — | — |
| 1 G_X | (0, G_X) | — | — | — | — | 1 | 1 | — | 1 | — |
| | (1, 0_X) | — | — | — | — | 1 | — | 1 | — | 1 |
| | (G_X, 0) | — | — | — | — | 1 | 1 | — | — | 1 |
| | (G_X, 1) | — | — | — | — | 1 | — | 1 | 1 | — |

"—" in the table represents "0".

When there is no G_X in (SLW #1, SLW #2), only one line in LSL_00, LSL_01, LSL_10, and LSL_11 is selected, the value of LSL_00, LSL_01, LSL_10, and LSL_11 is 1, OneX and XSL_00, XSL_01, XSL_10, and XSL_11 are all 0, N-type transistors connected thereto are turned on, and the value of the T terminal of corresponding MC cells is selected to the ML;

if LSL_00=1, the value of MC1.T is selected to the ML, marked as ML<=MC1.T;
if LSL_11=1, ML<=MC2.T;
if LSL_10=1, ML<=MC3.T;
if LSL_01=1, ML<=MC4.T;

in this case, OneX=0, the N-type transistor N1 is turned off, and ML_X is floating, marked as ML_x<=FLOAT;

when ML_x<=FLOAT, if ML=1, it is indicated that the value stored in the selected MC cell MC.F is 1, that is, the search result of the enhanced TL-TCAM cell circuit is match HIT; and if ML=0, the search result of the enhanced TL-TCAM cell circuit is mismatch MISS;

when there are two G_Xs in (SLW #1, SLW #2), LSL_00, LSL_01, LSL_10, LSL_11, XSL_00, XSL_01, XSL_10 XSL_11, and OneX are all 0, the N-type transistor N1 is turned off, ML_X<=FLOAT; the N-type transistor N5, the N-type transistor N6, the N-type transistor N9, and the N-type transistor N10 are turned off, ML<=FLOAT; in this case, the search result of the enhanced TL-TCAM cell circuit is match HIT;

when there is one G_X in (SLW #1, SLW #2), LSL_00, LSL_01, LSL_10, and LSL_11 are all 0; the N-type transistor N5, the N-type transistor N6, the N-type transistor N9, and the N-type transistor N10 are turned off, ML<=FLOAT;

when only one of XSL_00 and XSL_11 is selected:
if XSL_00 is selected, the N-type transistor N4 is turned on, and MA<=MC1.F;
if XSL_11 is selected, the N-type transistor N7 is turned on, and MA<=MC2.F;

when only one of XSL_10 and XSL_01 is selected:
if XSL_10 is selected, the N-type transistor N8 is turned on, and MB<=MC3.F;
if XSL_01 is selected, the N-type transistor N11 is turned on, and MB<=MC4.F;

OneX=1, and the N-type transistor N1 is turned on; in this case, if the MA line and the MB line are 1, both the N-type transistor N3 and the N-type transistor N2 are turned on, ML_x<=1, which indicates that the search result of the enhanced TL-TCAM cell circuit is mismatch MISS. If one of the MA line and the MB line is 0, or both are 0 at this time, and then at least one of the N-type transistor N2 and the N-type transistor N3 is turned off, ML_x<=FLOAT, which indicates that the search result of the enhanced TL-TCAM cell circuit is match HIT.

Table 4 summarizes the key signal states of the ETL-TCell cell during the search operation.

TABLE 4

Description of the search state of the ETL-TCell cell

| (SLW#1, SLW#2) | N5 N6 | N9 N10 | N4 N7 | N8 N11 | N1 N2 N3 | ML | ML_x | Search result HIT | MISS |
|---|---|---|---|---|---|---|---|---|---|
| No G_X | Four transistors. Only one transistor is turned on, and a corresponding MC.T value is selected to the ML | | Four transistors. All transistors are turned off | | N1 is turned off, and gate electrodes of N2 and N3 are floating | MC.T | Floating | when ML = 1 | when ML = 0 |
| 2 G_X | Four transistors. All transistors are turned off | | Four transistors. All transistors are turned off | | N1 is turned off, and gate electrodes of N2 and N3 are floating | Floating | Floating | Constant be HIT | N/A |
| 1 G_X | Four transistors. All transistors are turned off | | Only one of N4/N7 is turned on, and a corresponding MC.F is selected to the MA | | Only one of N8/N11 is turned on, and a corresponding MC.F is selected to the MB | N1 is turned on, N2 is determined by MB, and N3 is determined by MA | Floating | 1 or floating | when ML_x = FLOAT | when ML_x = 1 |

The search function of the sub-segment circuit of the enhanced TL-TCAM is as follows:

The value range of ML is {MC.T, FLOAT}, the value range of MC.T is {0, 1}, then the value range of ML is {{0, 1}, FLOAT}. Assuming that when the ML of a certain enhanced TL-TCAM cell circuit is 0, it is marked as ETL-TCell.ML=0, then regardless of the value of the ML of other enhanced TL-TCAM cell circuits in the sub-segment, the ML of the sub-segment circuit may be pulled to a lower voltage, which indicates that the search result of the sub-segment circuit is mismatch MISS. Assuming that it is pre-charged to a high level at the beginning, the ML voltage remains at a high level, and the search result of the sub-segment circuit is match HIT.

When the N-type transistor N15 is turned on, the ML is also pulled to a lower level, and the search result of the sub-segment circuit is "mismatch".

When search words (SLW #1, SLW #2) of each enhanced TL-TCAM cell circuit in the sub-segment circuit only contain an even number of G_Xs, that is, an even number of 0s or 2s, the signal line OneX_in-Sement_b=1, the N-type transistor N14 is turned on, OneX of each enhanced TL-TCAM cell circuit is 0, ML_x of the sub-segment circuit is 0, and the N-type transistor N15 of the sub-segment circuit is turned off. The state of the ML is only determined by the ML line of each ETL-TCell cell. ML of the sub-segment circuit is 1 represents that the sub-segment search result is match HIT, and ML=0 represents that the sub-segment search result is a mismatch MISS.

When the search words (SLW #1, SLW #2) of at least one enhanced TL-TCAM cell circuit in the sub-segment circuit contains an odd number of G_Xs, that is, an odd number of 1s, the signal line OneX_in-Sement_b=0, the ML of the sub-segment circuit is jointly determined by ML and ML_x of each enhanced TL-TCAM cell circuit. If ML_x in at least one enhanced TL-TCAM cell circuit is 1, the search result of the corresponding ETL-TCell cell is mismatch MISS, and at the same time, ML_x is charged to a high level, and ML_x of the sub-segment circuit is discharged to 0 by the N-type transistor N14 controlled by One_in_Segment_b at the beginning, causing that the N-type transistor N15 is turned on, and the ML of the sub-segment circuit is pulled to a low level, which indicates that the search result of the sub-segment circuit is mismatch MISS.

If the ML_x of all enhanced TL-TCAM cell circuits in the sub-segment circuit is FLOAT in this case, and the search result of each enhanced TL-TCAM cell circuit is match HIT, then the ML_x of the sub-segment circuit keeps the original low level, ML_x is reset to 0 by the N-type transistor N14 controlled by One_in_Segment_b at the beginning, the N-type transistor N15 is turned off, the ML of all enhanced TL-TCAM cell circuits is also FLOAT, and the ML of the sub-segment circuit also keeps the original high level, which indicates that the search result of the sub-segment circuit is match HIT.

Table 5 summarizes the above process.

TABLE 5

Description of the search state of the sub-segment circuit

| | OneX_in_Segment_b | ML_x | Search result HIT | Search result MISS |
|---|---|---|---|---|
| When the search words (SLW#1, SLW#2) of each ETL-TCell cell in the sub-segment only contain an even number of G_Xs (i.e., 0 or 2) | 1 | ML_x of each ETL-TCell cell in the sub-segment is floating | when ML = 1 | when ML = 0 |
| When the search words (SLW#1, SLW#2) of at least one ETL-TCell cell in the sub-segment only contain an odd number of G_Xs (i.e., 1) | 0 | When ML_x of at least one ETL-TCell cell in the sub-segment is 1 | N/A | ML = 0, and in this case, the search result of the sub-segment is "mismatch" |
| | | When ML_x of all ETL-TCell in the sub-segment is FLOAT | ML = FLOAT (keeping the original high level), and in this case, the search result of the sub-segment is "match" | N/A |

The search function of the word circuit of the enhanced TL-TCAM is as follows:

The search result of the word circuit is represented by the match line ML. The ML of the word circuit is the parallel connection of the ML of each sub-segment circuit. When the ML of the sub-segment circuit is 1, the ML of the word circuit is 1, which indicates that the search result of the word circuit is match HIT. When any ML of the sub-segment circuit is 0, the ML of the word circuit is 0, which indicates that the search result of the word circuit is mismatch MISS.

The read-write function of the present invention is as follows:

1. Read Operation

In this case, WL=1, alternately setting XSL_00 and XSL_11 to high level can read MC1.F and MC2.F from BL1. At the same time, alternately setting XSL_10 and XSL_01 to high level can read MC3.F and MC4.F from BL2. The read operation function description is as shown in Table 6.

TABLE 6

| | WL | XSL_00 | XSL11 | Read line BL1 | XSL_10 | XSL_01 | Read line BL2 |
|---|---|---|---|---|---|---|---|
| Description of the read operation function | | | | | | | |
| Read Operation | 1 | 1 | — | MC1.F | 1 | — | MC3.F |
| | | — | 1 | MC2.F | — | 1 | MC4.F |

Note:
"—" in the table represents "0".

2. Write Operation

During the write operation, WL=1.

Like the conventional SRAM, the write operation is completed by writing "0" in MC.F or MC.T.

To write "1" in the MC (MC.T=1), the XSL directly connected to the MC cell is set to 1, and the BL is set to 0 (in this case, LSL is 0). For example:

XSL_00=1, BL1=0, then MC1.F=0, that is, MC1.T=1;
XSL_11=1, BL1=0, then MC2.F=0, that is, MC2.T=1;
XSL_10=1, BL2=0, then MC3.F=0, that is, MC3.T=1;
XSL_01=1, BL2=0, then MC4.F=0, that is, MC4.T=1.

To write "0" in the MC (MC.T=0), the SL directly connected to the MC cell is set to 1, and the ML is set to 0 (in this case, XSL is 0). For example:

LSL_00=1, ML=0, then MC1.T=0;
LSL_11=1, ML=0, then MC2.T=0;
LSL_10=1, ML=0, then MC3.T=0;
LSL_01=1, ML=0, then MC4.T=0.

Table 7 and 8 summarize the truth tables for the write operation

TABLE 7

Control line truth table when writing 1

| Write operation | | WL | LSL | BL | XSL_00 | XSL_11 | XSL_10 | XSL_01 |
|---|---|---|---|---|---|---|---|---|
| Write 1 | MC1.F <= 0 | 1 | LSL_00 <= 0 | BL1 <= 0 | 1 | — | — | — |
| | MC2.F <= 0 | | LSL_11 <= 0 | BL2 <= 0 | — | 1 | — | — |
| | MC3.F <= 0 | | LSL_10 <= 0 | BL3 <= 0 | — | — | 1 | — |
| | MC4.F <= 0 | | LSL_01 <= 0 | BL4 <= 0 | — | — | — | 1 |

Note:
"—" in the table represents "0".

TABLE 8

Control line truth table when writing 0

| Write operation | | WL | XSL | ML | LSL_00 | LSL_11 | LSL_10 | LSL_01 |
|---|---|---|---|---|---|---|---|---|
| Write 0 | MC1.T <= 0 | 1 | XSL_00 <= 0 | 0 | 1 | — | — | — |
| | MC2.T <= 0 | | XSL_11 <= 0 | | — | 1 | — | — |
| | MC3.T <= 0 | | XSL_10 <= 0 | | — | — | 1 | — |
| | MC4.T <= 0 | | XSL_01 <= 0 | | — | — | — | 1 |

Note:
"—" in the table represents "0".

The descriptions above are only preferred specific embodiments of the present invention. However, the scope of protection of the present invention is not limited thereto. Any equivalent substitution or variation made by those skilled in the art within the technical scope disclosed by the present invention according to the technical solution and concept thereof of the present invention should all fall within the scope of protection of the present invention.

What is claimed is:

1. An enhanced TL-TCAM lookup-table hardware search engine, wherein each word circuit comprises a plurality of enhanced TL-TCAM cell circuits, and each of the enhanced TL-TCAM cell circuits comprises four memory cells MC1-MC4 and thirteen N-type transistors N1-N13; the memory cell MC adopts a bistable circuit structure, a stored value is located at a T terminal of the memory cell MC, and an F terminal of the memory cell MC stores its "NOT" value; a gate electrode of the N-type transistor N1 is connected to OneX, a source electrode of the N-type transistor N1 is connected to a power supply, and a drain electrode of the N-type transistor N1 is connected to a source electrode of the N-type transistor N2; a drain electrode of the N-type transistor N2 is connected to a source electrode of the N-type transistor N3, a drain electrode of the N-type transistor N3 is connected to ML_X, and a gate electrode of the N-type transistor N3 is connected to a source electrode of the N-type transistor N7; a gate electrode of the N-type transistor N7 is connected to XSL_11, and a drain electrode of the N-type transistor N7 is connected to an F terminal of the memory cell MC2; a T terminal of the memory cell MC2 is connected to a source electrode of the N-type transistor N6, a gate electrode of the N-type transistor N6 is connected to LSL_11, and a drain electrode of the N-type transistor N6 is connected a source electrode of the N-type transistor N5; a gate electrode of the N-type transistor N5 is connected to LSL_00, and a drain electrode of the N-type transistor N5 is connected to a T terminal of the memory cell MC1, and an F terminal of the memory cell MC1 is connected to a source electrode of the N-type transistor N4; a gate electrode of the N-type transistor N4 is connected to XSL_00, and a drain electrode of the N-type transistor N4 is connected to a source electrode of the N-type transistor N12; a gate electrode of the N-type transistor N12 is connected to a word line WL, and a drain electrode of the N-type transistor N12 is connected to a bit line BL1; the drain electrode of the N-type transistor N4 is connected to the source electrode of the N-type transistor N7 through an MA line; a gate electrode of the N-type transistor N2 is connected to a source electrode of the N-type transistor N8, a gate electrode of the N-type transistor N8 is connected to XSL_10, and a drain electrode of the N-type transistor N8 is connected to an F terminal of the memory cell MC3; a T terminal of the memory cell MC3 is connected to a source electrode of the N-type transistor N9, a gate electrode of the N-type transistor N9 is connected to LSL_10, and a drain electrode of the N-type transistor N9 is connected to a source electrode of the N-type transistor N10; a gate electrode of the N-type transistor N10 is connected to LSL_01, a drain electrode of the N-type transistor N10 is connected to a T terminal of the memory cell MC4; the F terminal of the memory cell MC3 is connected to a source electrode of the N-type transistor N11, a gate electrode of the N-type transistor N11 is connected to XSL_01, and a drain electrode of the N-type transistor N11 is connected to a source electrode of the N-type transistor N13; a gate electrode of the N-type transistor N13 is connected to the word line WL, a drain electrode of the N-type transistor N13 is connected to a bit line BL2; the drain electrode of the N-type transistor N11 is connected to the gate electrode of the N-type transistor N2 through a MB line; the source electrode of the N-type transistor N5 is connected to the drain electrode of the N-type transistor N9 through a match line ML;

m enhanced TL-TCAM cells circuits are connected in parallel to form a sub-segment circuit, wherein m is a positive integer; the word line WL, the match line ML and ML_x of each enhanced TL-TCAM cell circuit in the sub-segment circuit are respectively short-connected together; the match line ML is connected to a drain electrode of the N-type transistor N15, ML_x is connected to a gate electrode of the N-type transistor N15, and a source electrode of the N-type transistor N15 is connected to ground; ML_x is connected to a drain electrode of the N-type transistor N14, a source electrode of the N-type transistor N14 is connected to ground, and a gate electrode of the N-type transistor N14 is connected to a signal line OneX_in-Sement_b; and the plurality of sub-segment circuits are connected in parallel to form a word circuit.

2. The enhanced TL-TCAM lookup-table hardware search engine according to claim 1, wherein LSL_00, LSL_01, LSL_10, LSL_11, XSL_00, XSL_01, XSL_10, XSL_11, and OneX of a word circuit array are respectively connected to a decoder decode_SLW, the decoder decode SLW comprising a truth table as follows:

|  | (SLW#1, SLW#2) | LSL_00 | LSL_01 | LSL_10 | LSL_11 | OneX | XSL_00 | XSL_11 | XSL_01 | XSL_10 |
|---|---|---|---|---|---|---|---|---|---|---|
| No G_X | (0, 0) | 1 | — | — | — | — | — | — | — | — |
|  | (0, 1) | — | 1 | — | — | — | — | — | — | — |
|  | (1, 0) | — | — | 1 | — | — | — | — | — | — |
|  | (1, 1) | — | — | — | 1 | — | — | — | — | — |
| two G_Xs | (G_X, G_X) | — | — | — | — | — | — | — | — | — |
| one G_X | (0, G_X) | — | — | — | — | 1 | 1 | — | 1 | — |
|  | (1, G_X) | — | — | — | — | 1 | — | 1 | — | 1 |
|  | (G_X, 0) | — | — | — | — | 1 | 1 | — | — | 1 |
|  | (G_X, 1) | — | — | — | — | 1 | — | 1 | 1 | — |

"—" in the table represents "0".

* * * * *